US011038467B2

(12) United States Patent
Chien

(10) Patent No.: US 11,038,467 B2
(45) Date of Patent: Jun. 15, 2021

(54) POWER DETECTOR WITH ALL TRANSISTORS BEING BIPOLAR JUNCTION TRANSISTORS

(71) Applicant: RichWave Technology Corp., Taipei (TW)

(72) Inventor: Hwey-Ching Chien, Taipei (TW)

(73) Assignee: RichWave Technology Corp., Taipei (TW)

( * ) Notice: Subject to any disclaimer, the term of this patent is extended or adjusted under 35 U.S.C. 154(b) by 42 days.

(21) Appl. No.: 16/584,897

(22) Filed: Sep. 26, 2019

(65) Prior Publication Data

US 2020/0266764 A1 Aug. 20, 2020

(30) Foreign Application Priority Data

Feb. 19, 2019 (TW) .................................. 108105455

(51) Int. Cl.
*H03F 3/04* (2006.01)
*H03F 1/02* (2006.01)
(Continued)

(52) U.S. Cl.
CPC ............ *H03F 1/0211* (2013.01); *H02M 7/12* (2013.01); *H03F 3/21* (2013.01); *G01R 19/00* (2013.01);
(Continued)

(58) Field of Classification Search
CPC . H03F 1/0211; H03F 1/02; H03F 3/04; H03F 2200/471; H03F 3/21; H03F 3/14;
(Continued)

(56) References Cited

U.S. PATENT DOCUMENTS 4,972,512 A * 11/1990 Garskamp ................ H03D 1/00
455/341
5,298,811 A * 3/1994 Gilbert ..................... G06G 7/24
327/350

(Continued)

FOREIGN PATENT DOCUMENTS

EP 0 331 246 A1 9/1989
EP 0 599 399 A1 6/1994
(Continued)

OTHER PUBLICATIONS

Chien, Title of Invention: Signal Detector Including a Set of Resistors and a Collection Unit for Generating a Detection Signal, U.S. Appl. No. 15/658,409, filed Jul. 25, 2017.
(Continued)

*Primary Examiner* — Khanh V Nguyen
(74) *Attorney, Agent, or Firm* — Winston Hsu

(57) ABSTRACT

A power detector has a signal input terminal, N limiting amplifiers, N rectifiers and a signal output terminal. N is an integer greater than 1. The signal input terminal receives an input signal, and the signal output terminal outputs a detection signal. The N limiting amplifiers generate N amplified signals according to N attenuated signals having different attenuation. Each limiting amplifier receives one of the N attenuated signals and outputs one of the N amplified signals. Each rectifier receives a corresponding amplified signal and outputs a rectified signal. The detection signal is associated with the sum of N rectified signals outputted from the N rectifiers, and all transistors of the power detector are bipolar junction transistors.

16 Claims, 10 Drawing Sheets

(51) Int. Cl.
  *H02M 7/12* (2006.01)
  *H03F 3/21* (2006.01)
  *G01R 19/00* (2006.01)
  *H03G 7/00* (2006.01)
  *G06G 7/24* (2006.01)

(52) U.S. Cl.
  CPC .................. *G06G 7/24* (2013.01); *H03F 1/02* (2013.01); *H03G 7/001* (2013.01)

(58) Field of Classification Search
  CPC . H03F 3/68; H02M 7/12; H01R 21/12; H04B 17/318; H03G 1/0088; H03G 3/001; H03G 3/3036; H03G 7/02; H03G 3/22; H03G 3/3042; H03G 3/20; H03G 7/06; H03G 7/001; G01R 19/00; G01R 21/01
  USPC .................................................. 330/144, 284
  See application file for complete search history.

(56) References Cited

U.S. PATENT DOCUMENTS

| | | | |
|---|---|---|---|
| 5,338,985 A | | 8/1994 | Fotowat-Ahmady |
| 5,467,046 A | * | 11/1995 | Kimura .................. H03G 7/001 327/351 |
| 5,471,166 A | * | 11/1995 | Kimura .................... G06G 7/24 327/351 |
| 5,506,537 A | * | 4/1996 | Kimura .................... G06G 7/24 327/307 |
| 5,604,460 A | | 2/1997 | Sehrig |
| 6,408,008 B1 | | 6/2002 | Komarek |
| 6,879,816 B2 | | 4/2005 | Bult |
| 7,242,245 B2 | | 7/2007 | Burns |
| 8,581,574 B2 | * | 11/2013 | Eken ...................... G01R 15/09 324/140 R |
| 8,836,425 B2 | * | 9/2014 | Gilbert ................ H03F 3/45089 330/144 |
| 9,500,681 B2 | * | 11/2016 | Boucey ................ G01R 35/005 |
| 10,135,393 B2 | | 11/2018 | Chien |
| 2006/0084469 A1 | | 4/2006 | Malone |
| 2008/0297256 A1 | | 12/2008 | Eken |
| 2010/0097143 A1 | * | 4/2010 | Eken ...................... G01R 21/01 330/278 |
| 2014/0266832 A1 | | 9/2014 | Schrom |
| 2018/0191305 A1 | | 7/2018 | Chien |

FOREIGN PATENT DOCUMENTS

| | | |
|---|---|---|
| JP | 1-137712 A | 5/1989 |
| TW | 201409949 A | 3/2014 |
| TW | 201636625 A | 10/2016 |
| TW | 201706612 A | 2/2017 |
| TW | I607632 B | 12/2017 |
| WO | 2011/161858 A1 | 12/2011 |

OTHER PUBLICATIONS

Tao Zhang et al., 20 GHz Bipolar RF RMS Power Detectors, IEEE BCTM 12.2, 2005, pp. 204-207, XP010861865.

Jiayi Wang et al., A Wide Band CMOS Radio Frequency RMS Power Detector with 42-dB Dynamic Range, IEEE, 2015, pp. 1678-1681, XP033183506.

Jaewon Choi et al., Wide Dynamic-Range CMOS RMS Power Detector, IEEE Transactions on Microwave Theory and Techniques, vol. 64, No. 3, Mar. 2016, pp. 868-880, XP011608994.

* cited by examiner

POWER DETECTOR WITH ALL TRANSISTORS BEING BIPOLAR JUNCTION TRANSISTORS

CROSS REFERENCE TO RELATED APPLICATION

This application claims priority of Taiwan application No. 108105455, which was filed on Feb. 19, 2019, and is included herein by reference.

TECHNICAL FIELD

The present invention relates to a power detector, and more particularly to a power detector whose transistors are all bipolar junction transistors.

BACKGROUND

In the field of wireless communications, the performance of power detectors is critical. Some power detectors are accomplished by using a structure of a diode-type power detector. However, the diode-type power detector has an insufficient dynamic range and insufficient logarithmic linearity. In addition, some of the power detectors are fabricated using complementary metal oxide semiconductor (CMOS) or bipolar complementary metal-oxide semiconductor (BiCMOS) processes, but there is no power detector in the current market with all transistors being bipolar junction transistors (BJTs). In addition, some power detectors must use a power coupler disposed at the output end of the power amplifier and the input end of the power detector, but the power coupler has the disadvantage of being too large or occupying too much wiring area.

SUMMARY

An embodiment may provide a power detector comprising a signal input end, N limiting amplifiers, N rectifiers and a signal output end. The signal input end is used for receiving an input signal. The N limiting amplifiers are used for generating N amplified signals according to N attenuated signals having different attenuation amounts. N is an integer greater than 1. The N attenuated signals are related to the input signal. Each of the N limiting amplifiers comprises a first input end for receiving one of the N attenuated signals and a first output end for outputting one of the N amplified signals. The N rectifiers are coupled to the N limiting amplifiers, and each of the N rectifiers comprises a first input end and an output end. The first input end of each rectifier is used for receiving an amplified signal output by a first output end of a corresponding N limiting amplifier. The output end of each rectifier is used for outputting a rectified signal. The signal output end is used for outputting a detection signal. The detection signal is related to a sum of N rectified signals output by the N rectifiers, and all transistors of the power detector are bipolar junction transistors (BJTs).

DETAILED DESCRIPTION

Figure 1A:
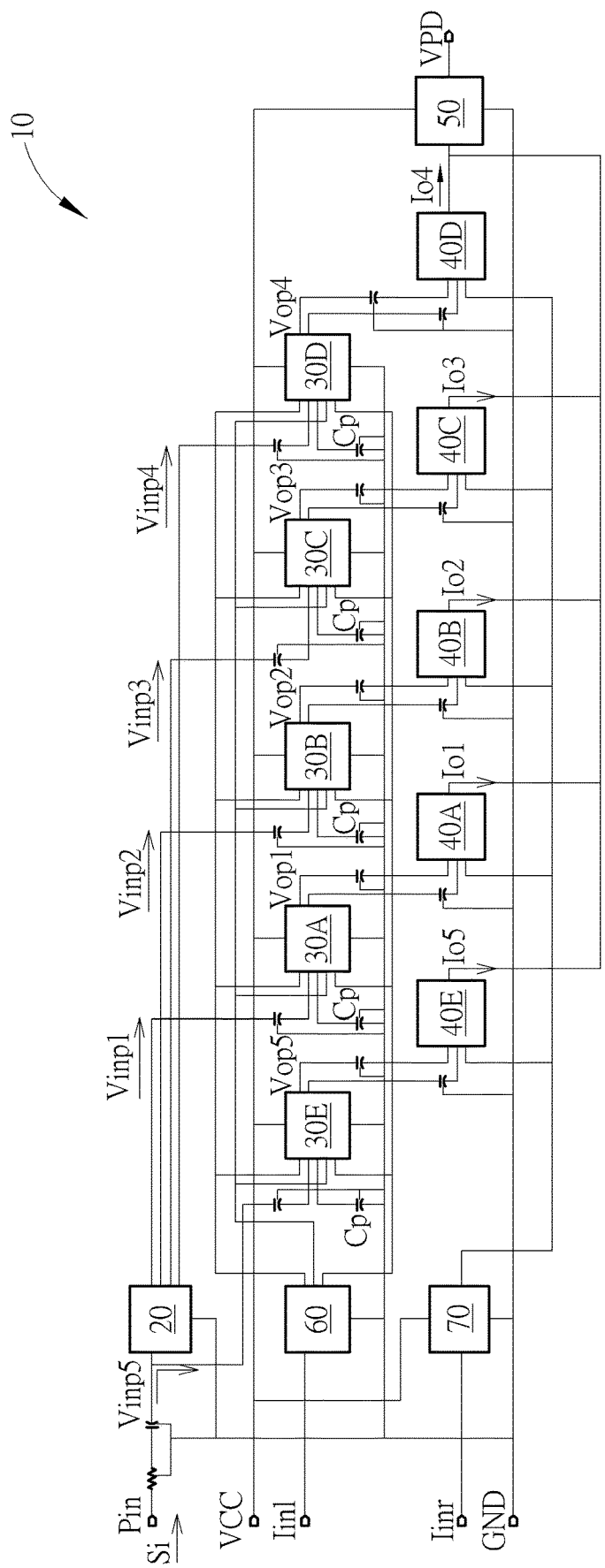
FIG. 1A is a functional block diagram of a power detector according to an embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Please refer to FIG. 1A. FIG. 1A is a functional block diagram of a power detector 10 according to an embodiment of the present invention. The power detector 10 comprises a signal input end Pin, N limiting amplifiers 30A to 30D, and N rectifiers 40A to 40D. N is an integer greater than one. In the embodiment, N is equal to 4, but the invention is not limited thereto. N may be other integers. For example, N may be 2, 3, 5 or more. The signal input end Pin is used to receive an input signal Si, and the input signal Si may be a radio frequency (RF) signal. The N limiting amplifiers 30A to 30D are used to generate N amplified signals Vop1 to Vop4 according to N attenuated signals Vinp1 to Vinp4 having different attenuation amounts. The N attenuated signals Vinp1 to Vinp4 are related to the input signal Si. In other words, the attenuated signals Vinp1 to Vinp4 may be obtained by attenuating the input signal Si. Each of the limiting amplifiers 30A to 30D comprises an input end for receiving an attenuated signal of the N attenuated signals Vinp1 to Vinp4, and an output end for outputting an amplified signal of the amplified signals Vop1 to Vop4. The N rectifiers 40A to 40D are coupled to the N limiting amplifiers 30A to 30D. Each of the rectifiers 40A to 40D comprises an input end for receiving an amplified signals Vop1, Vop2, Vop3 or Vop4 outputted by a corresponding one of the N limiting amplifiers 30A to 30D, and comprises an output end for outputting a rectified signal Io1, Io2, Io3 or Io4. Each of the rectified signals Io1 to Io4 may be a current signal.

The power detector 10 may further comprise an inverting amplifier 50. The inverting amplifier 50 is coupled to the N rectifiers 40A to 40D for performing amplification and inversion processes according to a sum of the N rectified signals Io1 to Io4 output by the N rectifiers 40A to 40D so as to output a detection signal VPD. The input end of the inverting amplifier 50 is coupled to the output ends of the N rectifiers 40A to 40D, and the output end of the inverting amplifier 50 is coupled to the signal output end of the power detector 10 to output the detection signal VPD. In the embodiment, the power detector 10 is a logarithmic power detector (LPD), but the invention is not limited thereto.

In another embodiment of the present invention, the power detector 10 may further comprise an $N+1^{th}$ limiting amplifier 30E and an $N+1^{th}$ rectifier 40E. The limiting amplifier 30E is coupled to a signal input end Pin. The input end of limiting amplifier 30E receives another attenuated signal Vinp5, while the output end of limiting amplifier 30E outputs another amplified signal Vop5. Among them, the amplitude of the attenuated signal Vinp5 is approximately equal to the amplitude of the input signal Si, and is slightly smaller than the amplitude of the input signal Si. The rectifier 40E is coupled to the limiting amplifier 30E. The input end of the rectifier 40E receives the amplified signal Vop5, while the output end of the rectifier 40E outputs another rectified signal Io5. Among them, the rectified signal Io5 can also be a current signal. In this embodiment, the inverting amplifier 50 is further coupled to the rectifier 40E for performing amplification and inversion processing according to the sum of the N+1 rectified signals Io1 to Io5 output by the N+1 rectifiers 40A to 40E so as to output the detection signal VPD.

Figure 1B:
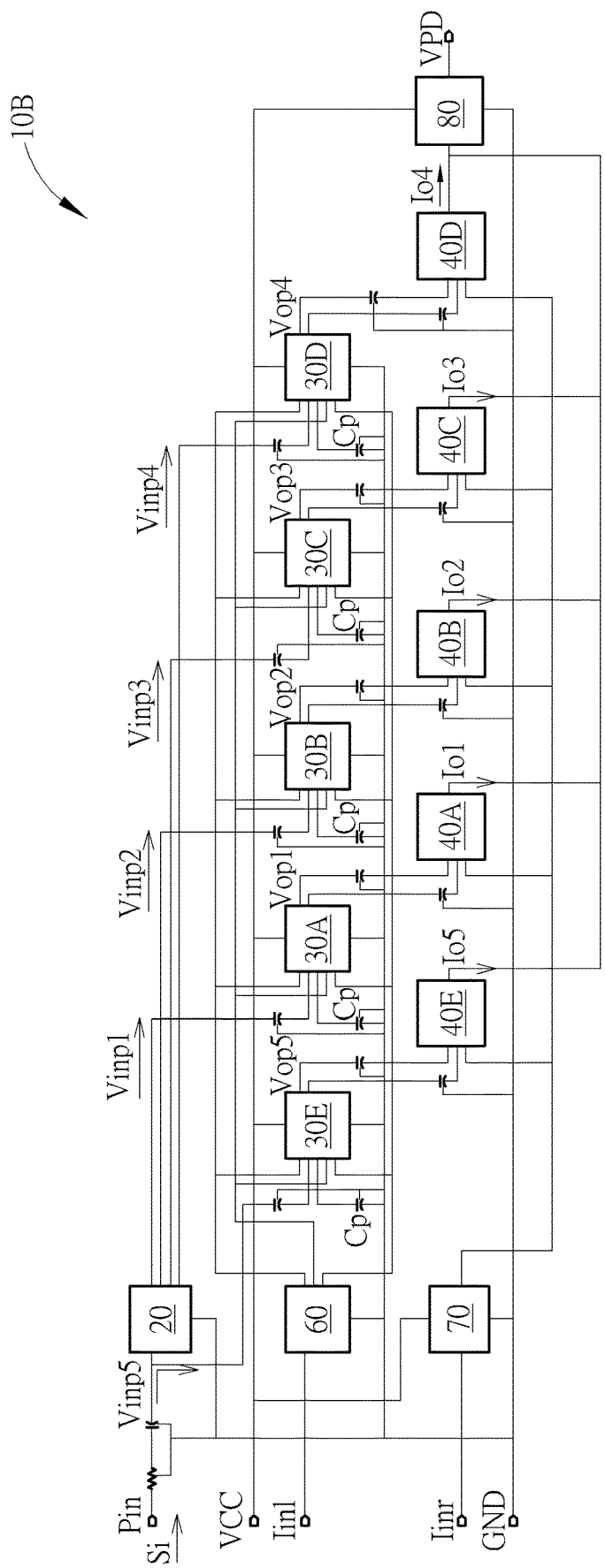
FIG. 1B is a functional block diagram of a power detector according to another embodiment of the present invention.
Figure 2:
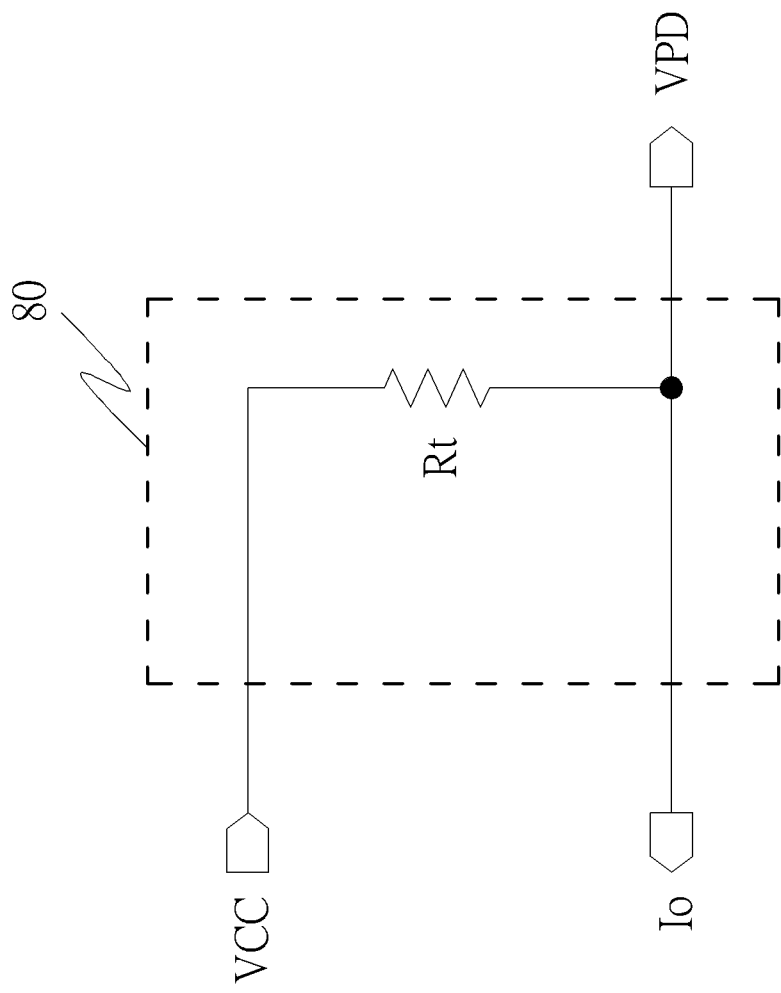
FIG. 2 is a circuit diagram of the conversion circuit in FIG. 1B.

In an embodiment of the invention, the inverting amplifier 50 of the power detector 10 may be replaced by a conversion circuit. Please refer to FIGS. 1B and 2. FIG. 1B is a functional block diagram of a power detector 10B according to another embodiment of the present invention, and FIG. 2 is a circuit diagram of a conversion circuit 80 in FIG. 1B. The differences between the power detector 10B and the power detector 10 in FIG. 1 are that the conversion circuit 80 of the power detector 10B replaces the inverting amplifier 50 of the power detector 10 and that the signal inverting processing of the power detector 10 is omitted in the power detector 10B. In the embodiment, the detection signal VPD is a voltage signal, and the conversion circuit 80 is used to convert the sum of the N rectified signals Io1 to Io4 output by the N rectifiers 40A to 40D into a detection signal VPD. Specifically, the conversion circuit 80 can comprise a conversion resistor Rt. A first end of the conversion resistor Rt is coupled to a system voltage VCC, and a second end of the conversion resistor Rt is coupled to the signal output end of the power detector 10 to output the detection signal VPD. The system voltage VCC may be a positive voltage.

Figure 3:
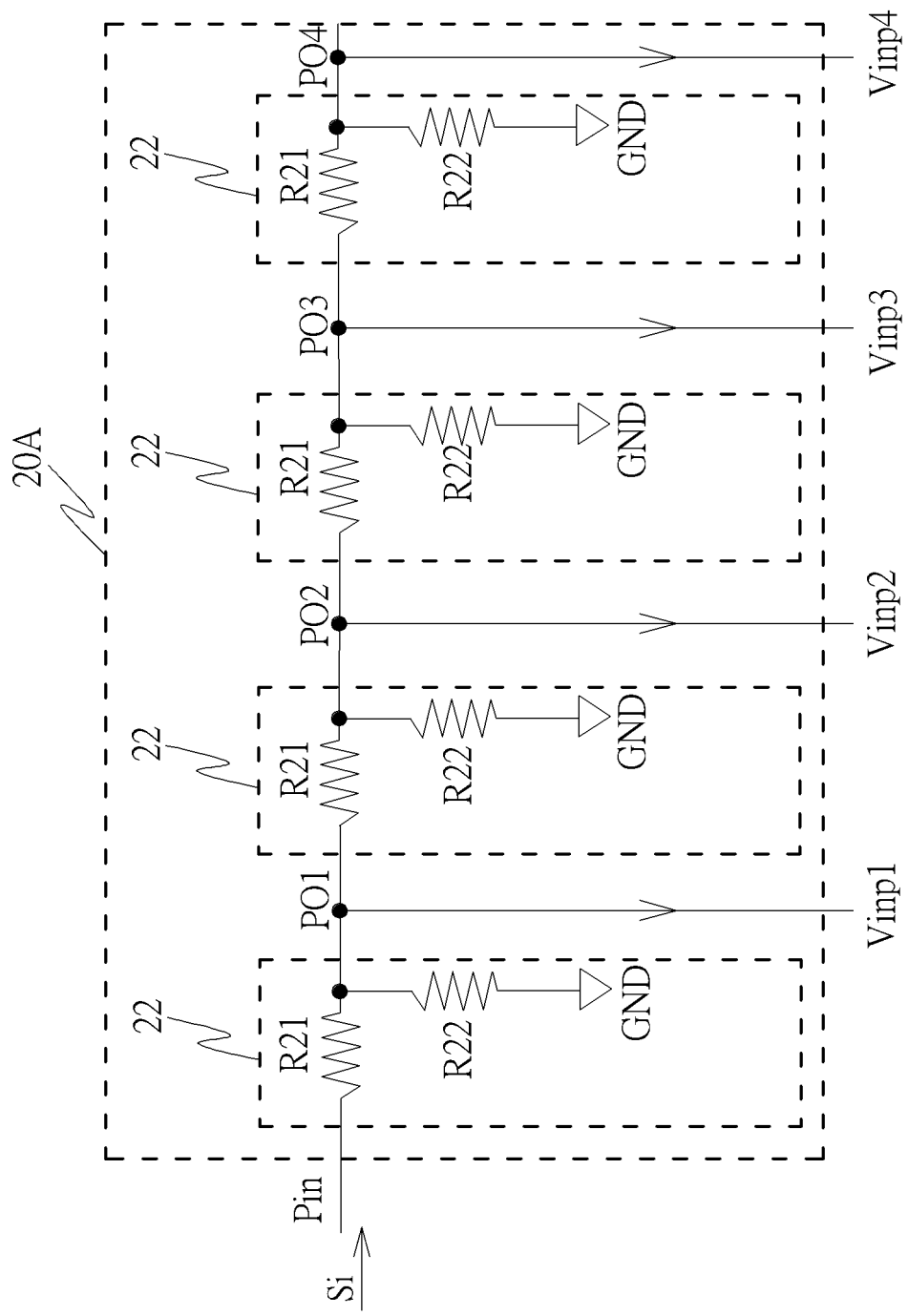
FIG. 3 is a first circuit diagram of an attenuation circuit of a power detector according to an embodiment of the present invention.

Please refer to FIG. 3. FIG. 3 is a first circuit diagram of an attenuation circuit 20A of a power detector according to an embodiment of the present invention. The attenuation circuit 20 in FIGS. 1A and 1B may be implemented by the attenuation circuit 20A in FIG. 3. The input end of the attenuation circuit 20A is coupled to the signal input end Pin, and the N output ends PO1 to PO4 of the attenuation circuit 20A are used to output the attenuated signals Vinp1 to Vinp4 having different attenuation amounts to the input ends of the N limiting amplifiers 30A to 30D respectively, wherein N is equal to 4 in this embodiment. In the embodiment, the attenuation circuit 20A comprises N attenuation units 22. The input end of the first attenuation unit 22 of the N attenuation units 22 is coupled to the signal input end Pin, and the output end of the first attenuation unit of the N attenuation units 22 is coupled to the input end of a corresponding limiting amplifier 30A through the output end P01 to output the attenuated signal Vinp1 to the limiting amplifier 30A. Furthermore, the input end of the $m^{th}$ attenuation unit 22 of the N attenuation units 22 is coupled to the $(m-1)^{th}$ output end of the N output ends PO1 to PO4, and the output end of the $m^{th}$ attenuation unit 22 of the N attenuation units 22 is coupled to the $m^{th}$ output end of the N output ends PO1 to PO4, where m is an integer and $1<m\leq N$. For example, the input end of the third attenuation unit 22 of the N attenuation units 22 is coupled to the second output end PO2 of the N output ends PO1 to PO4, and the output end of the third attenuation unit 22 of the N attenuation units 22 is coupled to the third output end PO3 of the N output ends PO1 to PO4. In addition, each attenuation unit 22 comprises resistors R21 and R22. A first end of the resistor R21 is coupled to the input end of the attenuation unit 22, and a second end of the resistor R21 is coupled to the output end of the attenuation unit 22. A first end of the resistor R22 is coupled to the output end of the attenuation unit 22, and a second end of the resistor R22 is coupled to the reference voltage GND. In the embodiment, the reference voltage GND is a ground voltage, but the invention is not limited thereto. Moreover, in an embodiment of the invention, the resistance of the resistor R22 may be twice the resistance of the resistor R21, such that the power detector 10 has a better linearity in dB. In detail, when the resistance of the resistor R22 in each attenuation unit 22 is twice the resistance of the resistor R21, the amplitude of the attenuated signal Vinp1 is half of the attenuated signal Vinp5 (i.e., minus 6 dB), the amplitude of the attenuated signal Vinp2 is half of the attenuated signal Vinp1, the amplitude of the attenuated signal Vinp3 is half of the attenuated signal Vinp2, and the amplitude of the attenuated signal Vinp4 is half of the attenuated signal Vinp3. Therefore, each time the signal passes through an attenuation unit 22, its amplitude is attenuated to half of the original amplitude (i.e., minus 6 dB). In addition, although the above description is based on that the resistance of the resistor R22 is twice the resistance of the resistor R21, the present invention is not limited thereto. In detail, in other embodiments of the present invention, the resistance of the resistor R22 may be M times the resistance of the resistor R21, and M is a number greater than 0 and not equal to 2.

Figure 4:
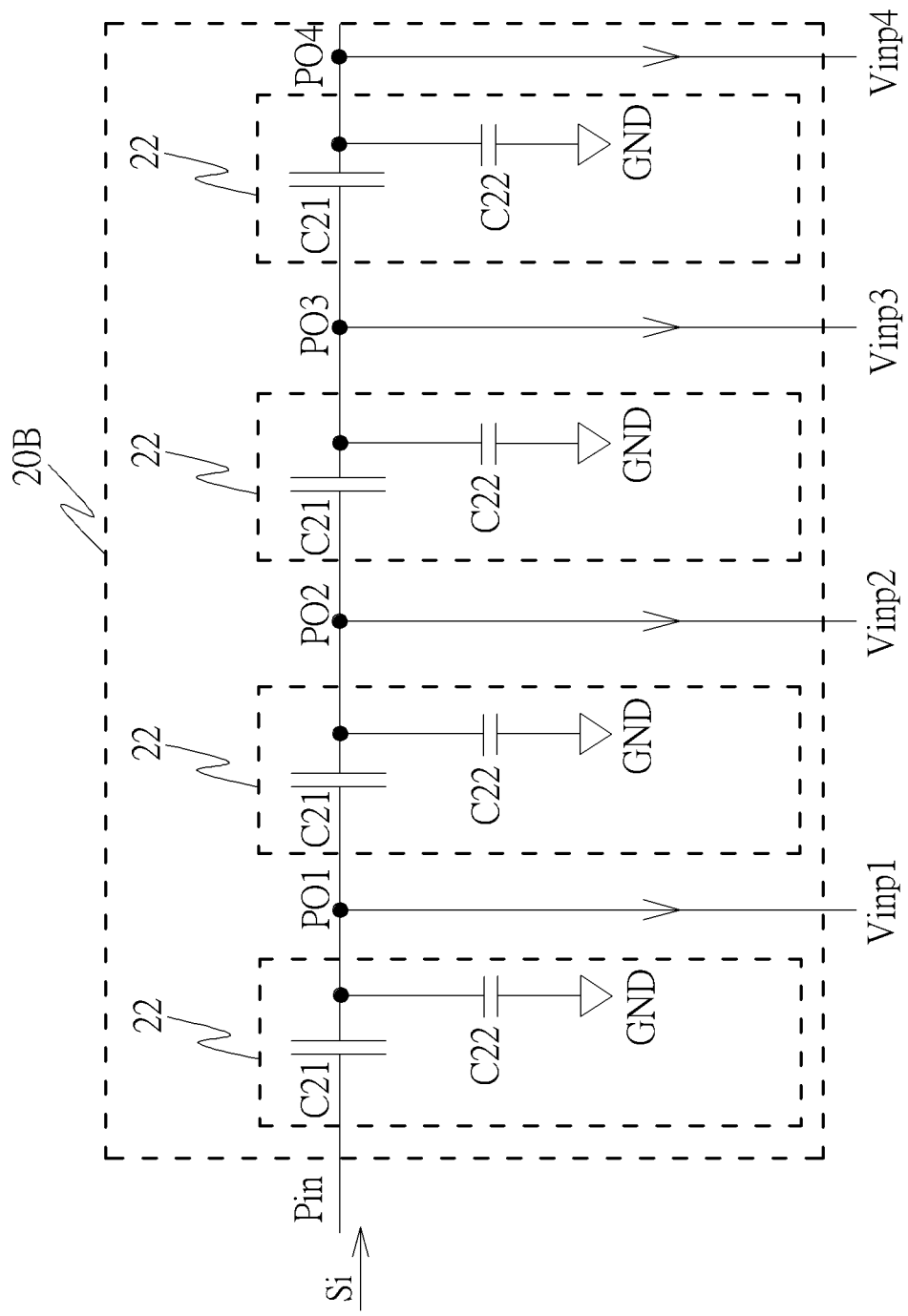
FIG. 4 is a second circuit diagram of an attenuation circuit of a power detector according to an embodiment of the present invention.

Please refer to FIG. 4. FIG. 4 is a first circuit diagram of an attenuation circuit 20B of a power detector according to an embodiment of the present invention. The attenuation circuit 20 in FIGS. 1A and 1B may be implemented by the attenuation circuit 20B in FIG. 4. In the embodiment, the attenuation circuit 20B comprises N attenuation units 22, and each attenuation unit 22 comprises capacitors C21 and C22. A first end of the capacitor C21 is coupled to the input end of the attenuation unit 22, and a second end of the capacitor C21 is coupled to the output end of the attenuation unit 22. A first end of the capacitor C22 is coupled to the output end of the attenuation unit 22, and a second end of the capacitor C22 is coupled to the reference voltage GND. In addition, in an embodiment of the present invention, the capacitance of the capacitor C22 may be half of the capacitance of the capacitor C21, so that the power detector 10 has a better linearity in dB. In detail, when the capacitance of the capacitor C22 in each attenuation unit 22 is half of the capacitance of the capacitor C21, the amplitude of the attenuated signal Vinp1 is half of the attenuated signal Vinp5, the amplitude of the attenuated signal Vinp2 is half of the attenuated signal Vinp1, the amplitude of the attenuated signal Vinp3 is half of the attenuated signal Vinp2, and the amplitude of the attenuated signal Vinp4 is half of the attenuated signal Vinp3. Therefore, each time a signal passes through an attenuation unit 22, its amplitude will decay to half of the original amplitude (i.e., minus 6 dB). In addition, although the above description is based on that the capacitance of the capacitor C22 is half of the capacitance of the capacitor C21, the present invention is not limited thereto. In particular, in other embodiments of the invention, the capacitance of the capacitor C22 is N times the capacitance of the capacitor C21, and N is a number greater than 0 and not equal to ½.

Figure 5:
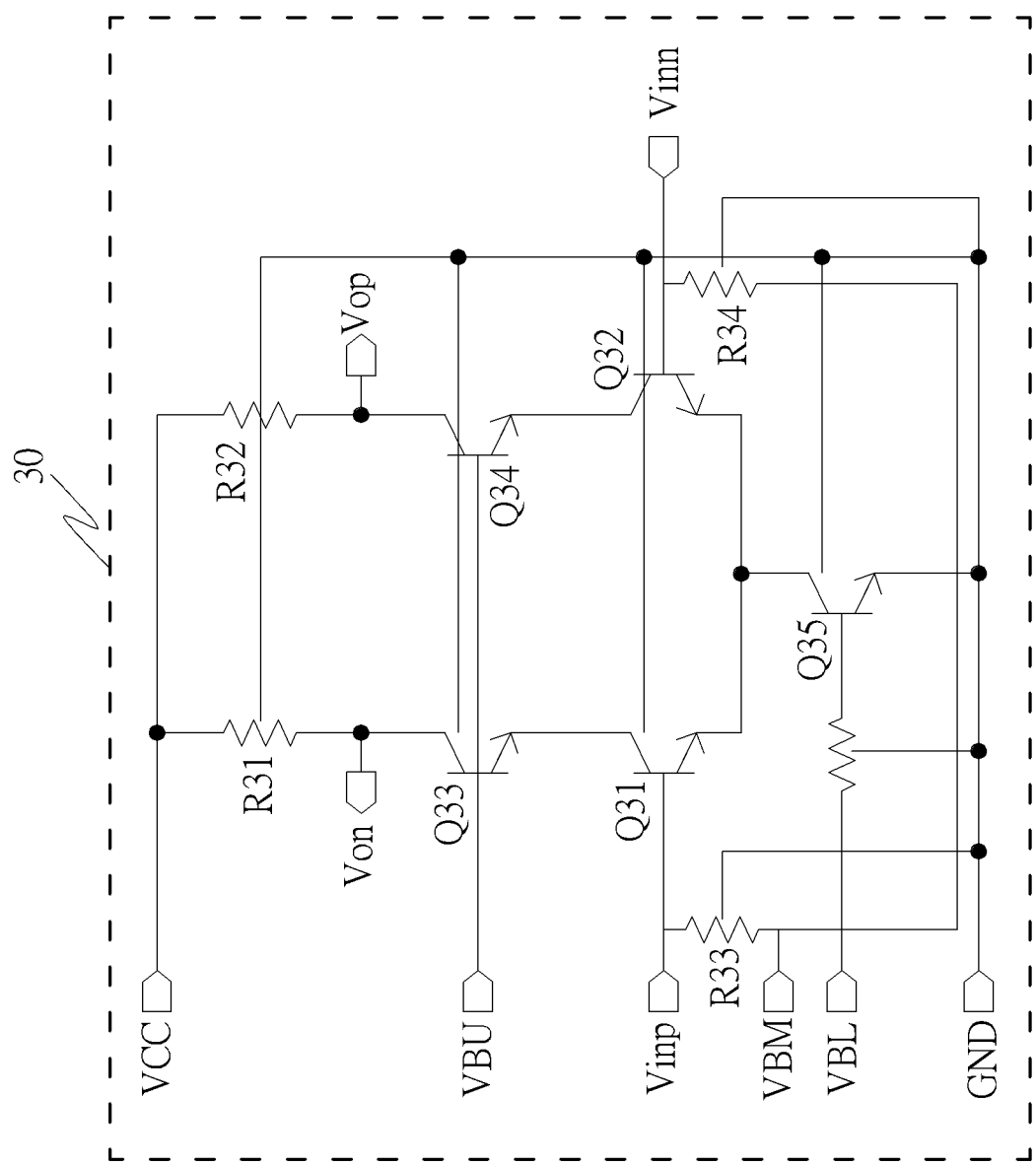
FIG. 5 is a circuit diagram of a limiting amplifier of a power detector according to an embodiment of the present invention.

In an embodiment of the invention, each of the limiting amplifiers 30A to 30E in FIGS. 1A and 1B is a differential amplifier and may be implemented by a limiting amplifier 30 illustrated in FIG. 5. Please refer to FIG. 5. FIG. 5 is a circuit diagram of the limiting amplifier 30 of a power detector of an embodiment of the present invention. The limiting amplifier 30 comprises transistors Q31, Q32, Q33, Q34 and Q35 and resistors R31 and R32. In the embodiment, the transistors Q31, Q32, Q33, Q34, and Q35 are all NPN type bipolar junction transistors (BJTs). A control end (i.e., the base) of the transistor Q31 is coupled to the input end Vinp of the limiting amplifier 30. When the limiting amplifier 30 is one of the limiting amplifiers 30A to 30D, the input end Vinp of the limiting amplifier 30 is coupled to the corresponding output end PO1, PO2, PO3 or PO4 of the attenuation circuit 20 or coupled to the input end of the attenuation circuit 20, so as to receive the corresponding attenuated signal Vinp1, Vinp2, Vinp3, or Vinp4 from the corresponding output end PO1, PO2, PO3, or PO4. When the limiting amplifier 30 is the limiting amplifier 30E, the input end Vinp of the limiting amplifier 30 is coupled to the input end of the attenuation circuit 20 to receive the attenuated signal Vinp5. A control end (i.e., the base) of the transistors Q32 is coupled to another input end Vinn of the limiting amplifier 30. The input end Vinn of the limiting amplifier 30 may be coupled to the reference voltage GND through the coupling capacitor Cp in FIGS. 1A and 1B, so that the signal inputted to the input end Vinn and the signal inputted to the input end Vinp are two complementary signals. A first end of the resistor R31 is coupled to the system voltage VCC, and a second end of the resistor R31 is coupled to the output end Von of the limiting amplifier 30. A first end of the resistor R32 is coupled to the system voltage VCC, and a second end of the resistor R32 is coupled to the second output end Vop of the limiting amplifier 30. A first end of the transistor Q33 is coupled to the first output end Von of the limiting amplifiers 30, a second end of the transistor Q33 is coupled to the first end of the transistor Q31, and a control end of the transistor Q33 is coupled to the limiting amplifier bias VBU. A first end of the transistor Q34 is coupled to the output end Vop of the limiting amplifier 30, a second end of the transistor Q34 is coupled to the first end of the second transistor Q32, and a control end of the transistor Q34 is coupled to the limiting amplifier bias VBU. A first end of the transistor Q35 is coupled to the second end of the transistor Q31 and the second end of the transistor Q32. A second end of the transistor Q35 is coupled to the reference voltage GND, and a control end of the transistor Q35 is coupled to the limiting amplifier bias VBL. In this embodiment, the limiting amplifier bias VBU is higher than the limiting amplifier bias VBL. Moreover, in another embodiment of the invention, each limiting amplifier 30 may further comprise resistors R33 and R34. A first end of the resistor R33 is coupled to the input end Vinp of the limiting amplifier 30, and a second end of the resistor R33 is coupled to a limiting amplifier bias VBM. The limiting amplifier bias VBM is between the two limiting amplifier biases VBU and VBL. A first end of the resistor R34 is coupled to the input end Vinn of the limiting amplifier 30, and a second end of the resistor R34 is coupled to the limiting amplifier bias VBM. After the two complementary signals of the two input ends Vinp and Vinn inputted to the limiting amplifier 30 are amplified by the limiting amplifier 30, the limiting amplifier 30 outputs two complementary amplified signals from the two output ends Vop and Von, respectively. The amplified signal outputted by the output end Vop is one of the amplified signals Vop1 to Vop5.

In an embodiment of the present invention, the transistors Q33 and Q34 in the limiting amplifier 30 may be omitted, and the second end of the resistor R31 may be directly coupled to the first end of the transistor Q31, and the second end of the resistor R32 may be directly coupled to the first end of the transistor Q32. Moreover, the limiting amplifier 30 with the transistors Q33 and Q34 may have a larger bandwidth for the attenuated signals Vinp1 to Vinp5 than the limiting amplifier 30 without the transistors Q33 and Q34.

Compared to the N limiting amplifiers 30A to 30D in FIGS. 1A and 1B, which are implemented in parallel, in another embodiment of the present invention, the N limiting amplifiers 30A to 30D may be connected in series (i.e., cascaded). The first limiting amplifiers 30A may directly receive the input signal Si as its received attenuated signal (equivalent to Vinp1), and amplify the received attenuated signal to output the amplified signal Vop1 to the second limiting amplifier 30B such that an attenuated signal (equivalent to Vinp2) would be inputted to the limiting amplifier 30B. Furthermore, in the embodiment in which the limiting amplifiers 30A to 30D are connected in series, each of the limiting amplifiers 30B to 30D other than the first limiting amplifier 30A receives the amplified signal of a previous stage limiting amplifier as its input signal. For example, the limiting amplifier 30C receives an attenuated signal amplified by the limiting amplifier 30B as its input signal (equivalent to Vinp3); the limiting amplifier 30D receives an attenuated signal amplified by the limiting amplifiers 30C as its input signal (equivalent to Vinp4).

Figure 6:
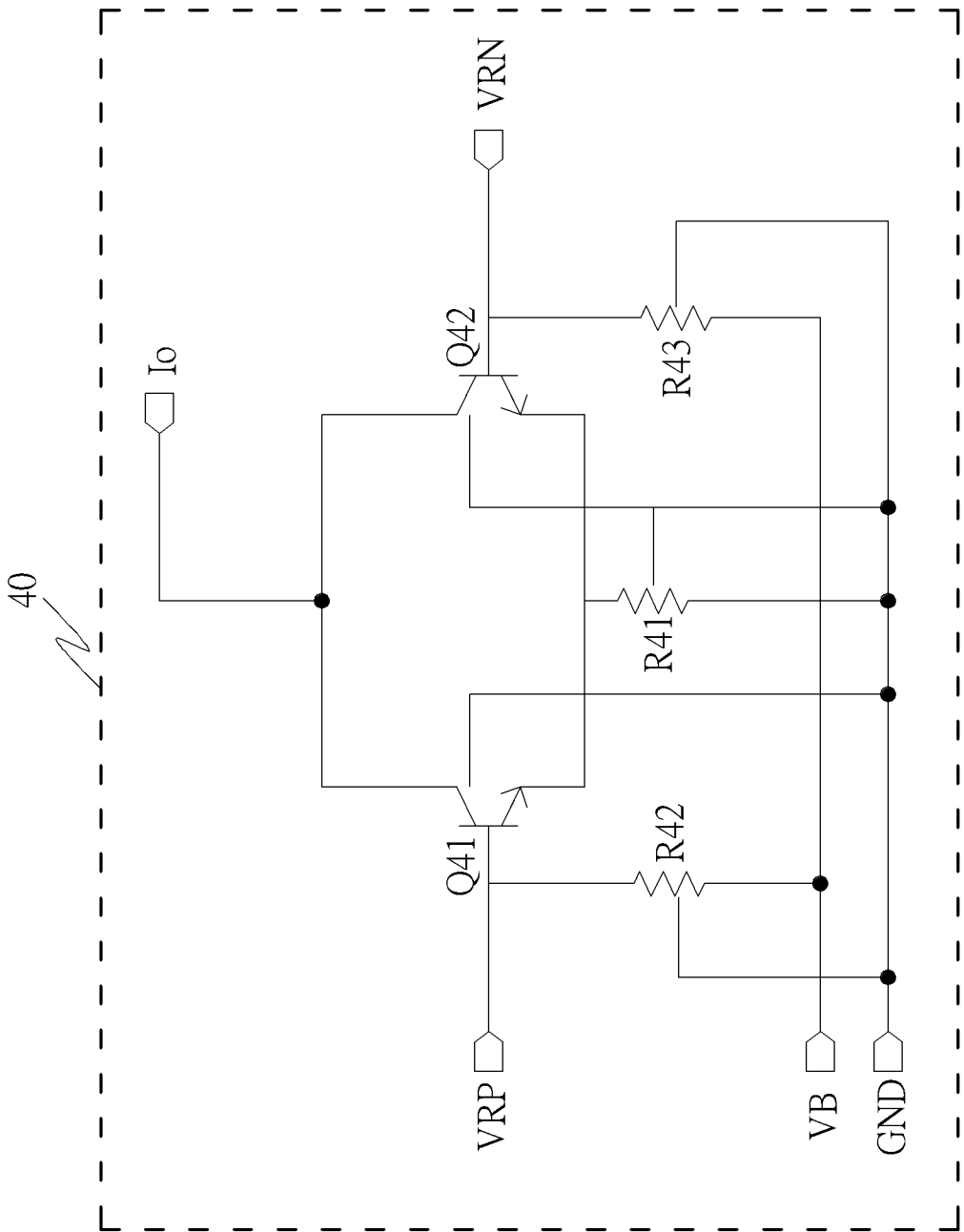
FIG. 6 is a circuit diagram of a rectifier of a power detector according to an embodiment of the present invention.

In an embodiment of the present invention, each of the rectifiers 40A to 40E in FIGS. 1A and 1B may be implemented by a rectifier 40 in FIG. 6. Please refer to FIG. 6. FIG. 6 is a circuit diagram of the rectifier 40 of a power detector according to an embodiment of the present invention. In the embodiment, each rectifier 40 may be a class-B full-wave rectifier, so the rectifier 40 may be used without a standby current and can effectively save energy. Each rectifier 40 contains two input ends VRP and VRN, transistors Q41 and Q42, and resistors R41 to R43. The two input ends VRP and VRN receive two complementary amplified signals output from the two output ends Vop and Von of the corresponding limiting amplifier 30. In detail, the input end VRP of the rectifier 40 is coupled to the output end Vop of the corresponding limiting amplifier 30 to receive one of the output signals Vop1 to Vop5 from the output end Vop. The other input end VRN of the rectifier 40 is coupled to the other output end Von of the corresponding limiting amplifier 30 to receive another complementary amplified signal from the output terminal Von. A first end of the transistor Q41 is coupled to the output end Io of the rectifier 40, and a control end of the first transistor Q41 is coupled to the output end Vop of the limiting amplifier 30 via the input end VRP. A first end of the transistor Q42 is coupled to the output end Io of the rectifier 40, and a control end of the transistor Q42 is coupled to the output end Von of the limiting amplifier 30 via the input end VRN. A first end of the resistor R41 is coupled to the second end of the transistor Q41 and the second end of the transistor Q42, and a second end of the resistor R41 is coupled to the reference voltage GND. A first end of the resistor R42 is coupled to the control end of the transistor Q41, and a second end of the resistor R42 is coupled to the rectifying bias VB. A first end of the resistor R43 is coupled to the control end of the transistor Q41, and a second end of the resistor R43 is coupled to the rectifying bias VB. When the two complementary signals input to the two ends VRP and VRN of the rectifier 40 are rectified by the rectifier 40, the rectifier 40 outputs one of the rectified signals Io1 to Io5 from their output ends Io. In this embodiment, the rectified signal output by the rectifier 40 is a current signal.

Figure 7:
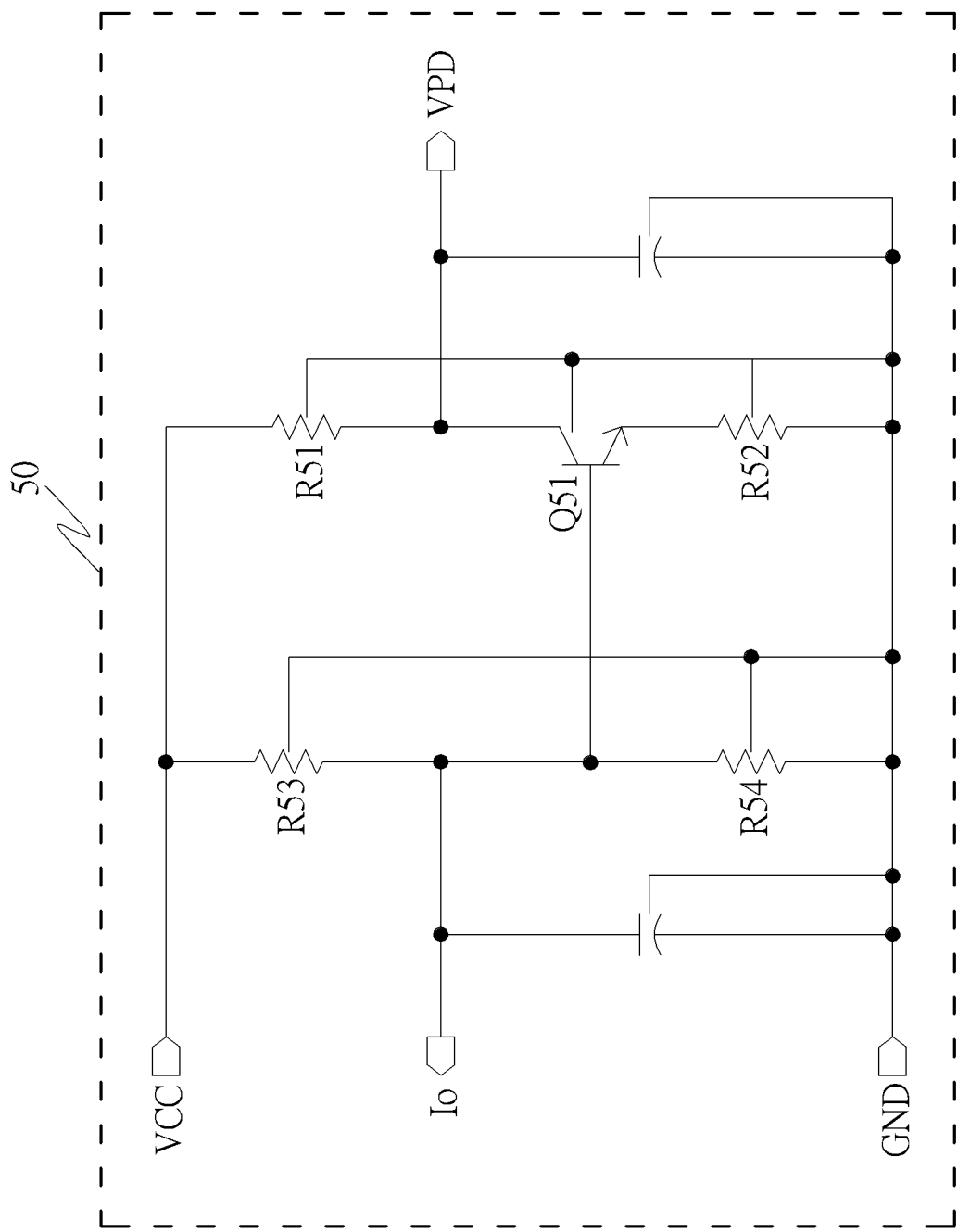
FIG. 7 is a circuit diagram of the inverting amplifier of the power detector in FIG. 1A.

Please refer to FIG. 7. FIG. 7 is a circuit diagram of the inverting amplifier 50 of the power detector 10 in FIG. 1A. The input end of the inverting amplifier 50 is coupled to the output end Io of each of the rectifiers 40A to 40E to receive and collect the rectified signals Io1 to Io5 from the rectifiers 40A to 40E so as to perform amplification and inversion processes according to a sum of the rectified signals Io1 to Io5 output by the rectifiers 40A to 40E to output the detection signal VPD. In addition, in an embodiment in which the power detector 10 does not have the $(N+1)^{th}$ limiting amplifier 30E and the $(N+1)^{th}$ rectifier 40E, the input end of the inverting amplifier 50 is coupled to the output end Io of each of the rectifiers 40A to 40E to receive the rectified signals Io1 to Io4 from the respective rectifiers 40A to 40D so as to perform amplification and inversion processes according to a sum of the rectified signals Io1 to Io4 output by the rectifiers 40A to 40D to output the detection signal VPD. In the embodiment, the inverting amplifier 50 comprises resistors R51 and R52 and a transistor Q51. A first end of the resistor R51 is coupled to the system voltage VCC, and a second end of the resistor R51 is coupled to the output end VPD of the inverting amplifier 50. A first end of the resistor R52 is coupled to the output end VPD of the inverting amplifier 50, and a second end of the resistor R52 is coupled to the reference voltage GND. A first end of the transistor Q51 is coupled to the second end of the resistor R1, a second end of the transistor Q51 is coupled to the first end of the resistor R52, and a control end of the transistor Q51 is coupled to the input end Io of the inverting amplifier 50. In another embodiment of the present invention, the inverting amplifier 50 may further comprise resistors R53 and R54. A first end of the resistor R53 is coupled to the system voltage VCC, and a second end of the resistor R53 is coupled to the input end Io of the inverting amplifier 50. A first end of the resistor R54 is coupled to the input end Io of the inverting amplifier 50, and a second end of the resistor R54 is coupled to the reference voltage GND.

Figure 8:
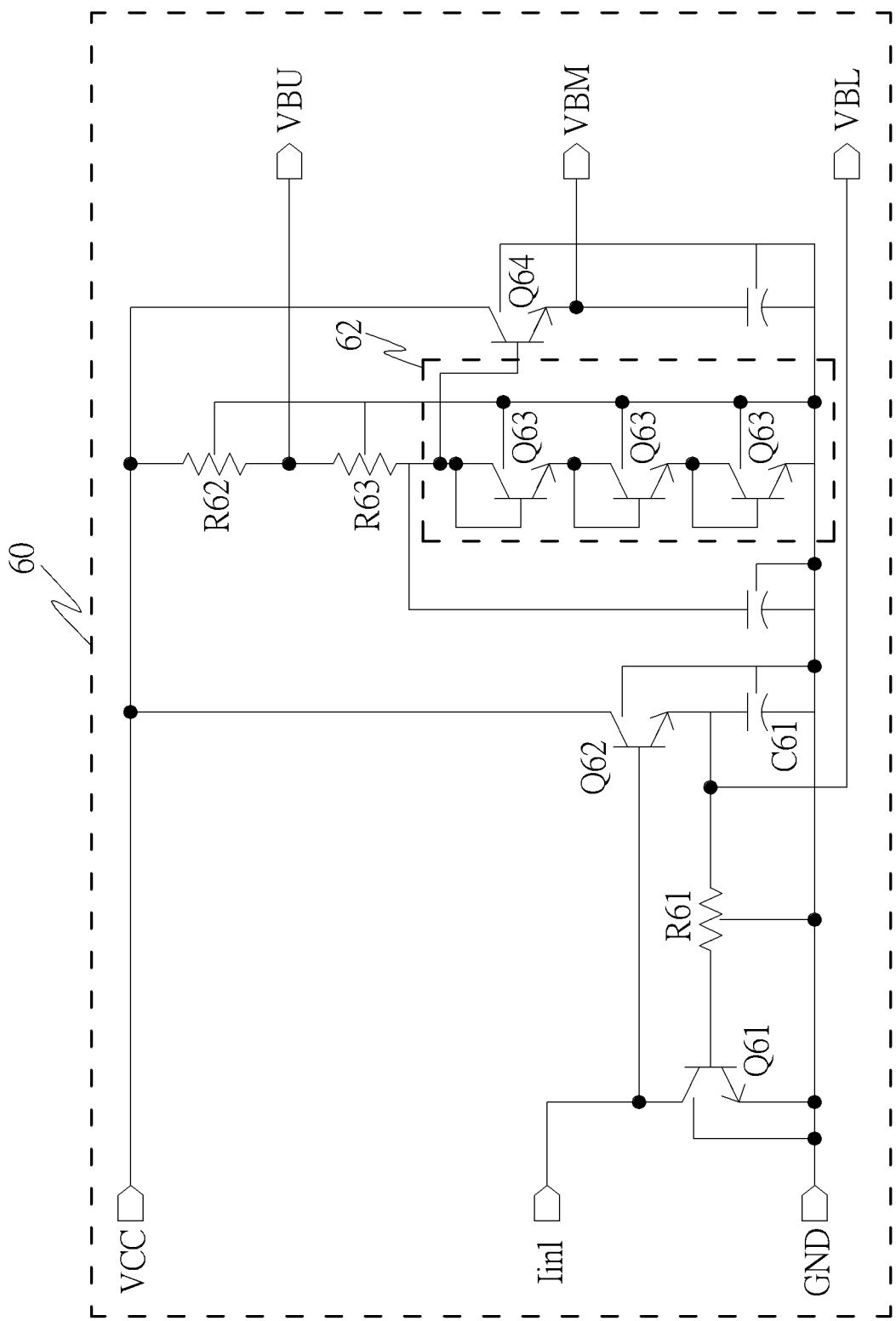
FIG. 8 is a circuit diagram of a limiting amplifier bias circuit of the power detector in FIG. 1A.

Please refer to FIGS. 1A and 8. FIG. 8 is a circuit diagram of a limiting amplifier bias circuit 60 of the power detector 10 in FIG. 1A. The power detector 10 may further comprise the limiting amplifier bias circuit 60 for generating the above-described limiting amplifier biases VBU, VBM, and VBL. The limiting amplifier bias circuit 60 comprises transistors Q61 and Q62, resistors R61, R62 and R63, and a capacitor C61. A first end of the transistor Q61 is coupled to a current source Iin1, and a second end of the transistor Q61 is coupled to the reference voltage GND. The current source Iin1 is very small and may be about 1 microampere (μA), which helps the power detector 10 to save energy. A first end of the transistor Q62 is coupled to the system voltage VCC, and a control end of the transistor Q62 is coupled to the current source Iin1. A first end of the resistor R61 is coupled to the control end of the sixth transistor Q61, and a second end of the resistor R61 is coupled to the second end of the seventh transistor Q62 and used to output the second limiting amplifier bias VBL. A first end of the capacitor C61 is coupled to the second end of the first resistor R61, and a second end of the capacitor C61 is coupled to the reference voltage GND. A first end of the resistor R62 is coupled to the system voltage VCC, and a second end of the resistor R62 is used to output the limiting amplifier bias VBU. A first end of the resistor R63 is coupled to the second end of the second resistor R62. In another embodiment of the invention, the limiting amplifier bias circuit 60 may further comprise a bias circuit 62. The bias circuit 62 comprises a plurality of diode units Q63 connected in series. A first end of the bias circuit 62 is coupled to the second end of the resistor R63, and a second end of the bias circuit 62 is coupled to the reference voltage GND. In the embodiment, each of the diode units Q63 is composed of an NPN type BJT whose base and collector are coupled to each other. Taking the bias circuit 62 of FIG. 8 as an example, the bias circuit 62 has three diode units Q63, so the voltage level of the second end of the resistor R63 is higher than the reference voltage GND by three times of the voltage difference between the emitter and base (i.e., $3V_{BE}$). Because of the transistor Q64, the limiting amplifier bias VBM will be lower than the voltage level of the second end of the resistor R63 by the voltage difference between the emitter and the base (i.e., $V_{BE}$). Therefore, the limiting amplifier bias VBM will be higher than the reference voltage GND by two times of the voltage difference between the emitter and base (i.e., $2V_{BE}$).

Figure 9:
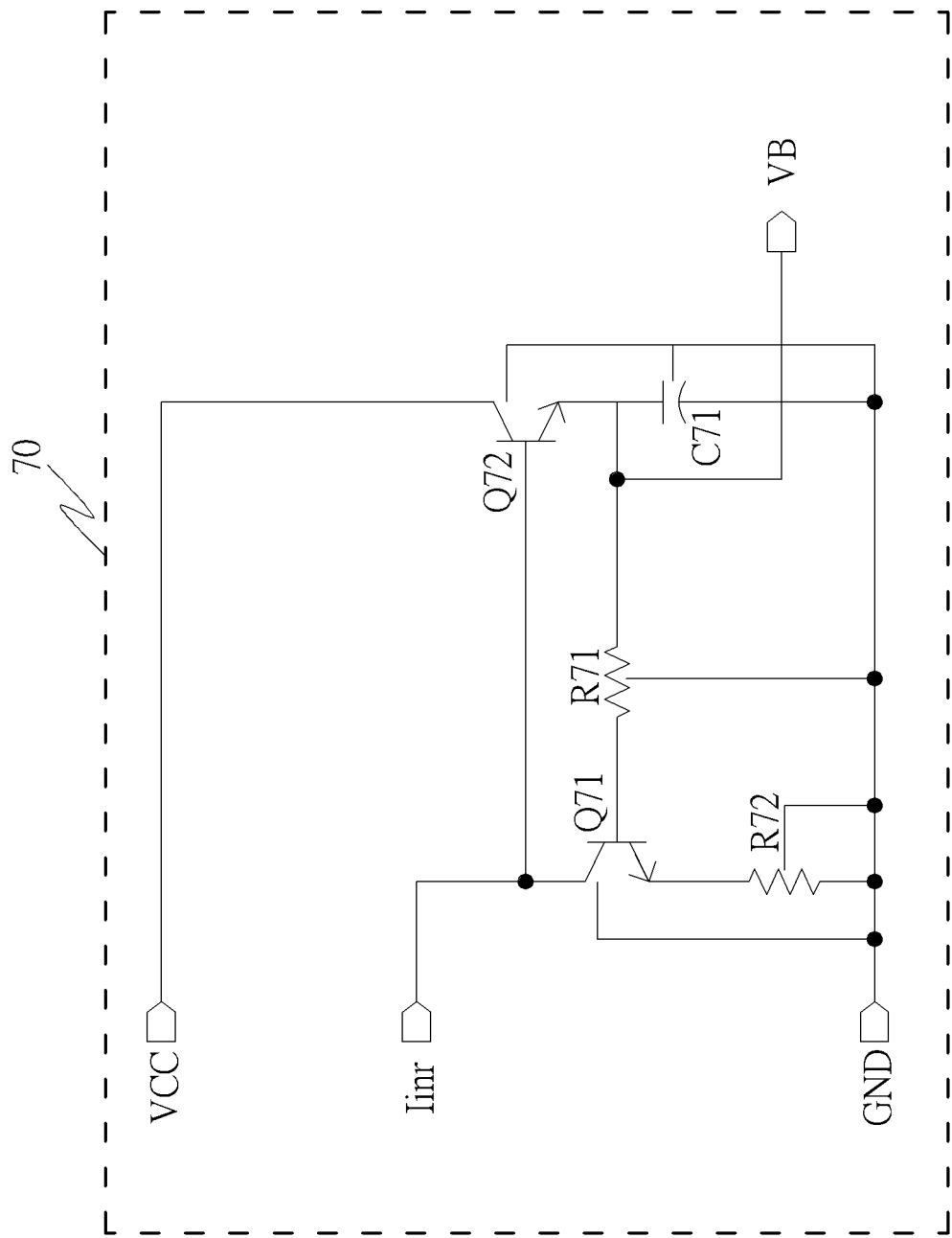
FIG. 9 is a circuit diagram of the rectifier bias circuit of the power detector in FIG. 1A.

Please refer to FIGS. 1A and 9. FIG. 9 is a circuit diagram of a rectifier bias circuit 70 of the power detector 10 in FIG. 1A. The power detector 10 may further comprise the rectifier bias circuit 70 for generating the rectifying bias VB. The rectifier bias circuit 70 comprises transistors Q71 and Q72. A first end of the transistors Q71 is coupled to the current source Iinr. The current source Iinr is very small and may be about 1 microampere (μA), which helps the power detector 10 to save energy. A first end of the transistor Q72 is coupled to the system voltage VCC, and a control end of the transistor Q72 is coupled to the current source Iinr. In another embodiment of the present invention, the rectifier bias circuit 70 may further comprise a resistor R71, a capacitor C71, and a resistor R72. A first end of the resistor R71 is coupled to the control end of the transistor Q71, and a second end of the resistor R71 is coupled to the second end of the transistor Q72 to output the rectifying bias VB. A first end of the capacitor C71 is coupled to the second end of the resistor R71, and a second end of the capacitor C71 is coupled to the reference voltage GND. A first end of the resistor R72 is coupled to the second end of the transistor Q71, and a second end of the resistor R72 is coupled to the reference voltage GND. In another embodiment of the present invention, the transistor Q72 of the rectifier bias circuit 70 has the same width-to-length ratio (W/L ratio) as the transistor Q41 of each rectifier 40, so that the current flowing through the transistor Q72 may be very close to the current flowing through the transistor Q41. In addition, since the current flowing through the transistor Q72 is approximately equal to the current source Iinr, the currents flowing through the transistors Q72 and Q41 may be very small (approximately 1 microampere) when the current source Iinr is very small. Therefore, it is helpful for energy saving of the power detector 10.

It may be noted that all of the transistors of the power detector 10 may be bipolar junction transistors (BJTs), and in particular, may be NPN type bipolar junction transistors, as shown in FIG. 1A to FIG. 9. Therefore, the active components of the power detector 10 would only comprise NPN type bipolar junction transistors, and the passive components of the power detector 10 would only comprise resistors and capacitors. Therefore, the power detector 10 of the present invention is suitable for being manufactured by a gallium arsenide (GaAs) process. More particularly, the power detector 10 of the present invention is suitable for being manufactured by a gallium arsenide (GaAs) NPN-type heterogeneous bipolar junction transistor (HBT) process.

As compared to prior art wireless power detectors, the power detector of the present invention may not require a power coupler. In addition, the limiting amplifiers of the power detector of the present invention may be coupled in parallel to replace serial-connected limiting amplifiers. Therefore, the bandwidth of the limiting amplifiers in the present invention would hardly be reduced even if the number of the stages of limiting amplifiers is increased. In addition, the rectifiers of the power detector of the present invention may be class-B full-wave rectifiers, so that a standby current for the rectifiers could be omitted, and energy may be effectively saved. In addition, all of the transistors in the power detector of the present invention may be NPN type bipolar junction transistors, and an output curve of the power detector may have a positive slope by using the inverting amplifier, thereby enabling the power detector of the present invention to be used in most wireless power detectors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A power detector, comprising:
   a signal input end for receiving an input signal;
   N limiting amplifiers for generating N amplified signals according to N attenuated signals having different attenuation amounts, N being an integer greater than 1, wherein the N attenuated signals are related to the input signal, and each of the N limiting amplifiers comprises:
     a first input end for receiving one of the N attenuated signals; and
     a first output end for outputting one of the N amplified signals;
   N rectifiers coupled to the N limiting amplifiers, each of the N rectifiers comprising:
     a first input end for receiving an amplified signal output by a first output end of a corresponding N limiting amplifier; and
     an output end for outputting a rectified signal;
   a signal output end for outputting a detection signal; and
   an inverting amplifier coupled to the N rectifiers for performing amplification and inversion processes according to a sum of N rectified signals output by the N rectifiers so as to output the detection signal, the inverting amplifier comprising:
     an input end coupled to output ends of the N rectifiers; and
     an output end coupled to the signal output end of the power detector for outputting the detection signal;
   wherein the detection signal is related to the sum of the N rectified signals output by the N rectifiers, and all transistors of the power detector are bipolar junction transistors (BJTs).

2. The power detector of claim 1, further comprising an attenuation circuit, the attenuation circuit comprising:
   an input end coupled to the signal input end; and
   N output ends for respectively outputting the N attenuated signals to first input ends of the N limiting amplifiers.

3. The power detector of claim 2, further comprising:
   an $N+1^{th}$ limiting amplifier, coupled to the signal input end, and comprising:
     a first input end for receiving an $N+1'$ attenuated signal; and
     a first output end for outputting an $N+1^{th}$ amplified signal; and
   an $N+1^{th}$ rectifier coupled to the $N+1^{th}$ limiting amplifier, and comprising:
     a first input end for receiving the $N+1^{th}$ amplified signal; and
     an output end for outputting an $N+1^{th}$ rectified signal;
   wherein the inverting amplifier is further coupled to the $N+1^{th}$ rectifier for performing amplification and inversion processes according to a sum of the N+1 rectified signals output by the N+1 rectifiers so as to output the detection signal.

4. The power detector of claim 3, wherein each limiting amplifier further comprises:
   a first transistor having a control end coupled to the first input end of the each limiting amplifier;
   a second transistor having a control end coupled to a second input end of the each limiting amplifier;
   a first resistor having a first end coupled to a system voltage and a second end coupled to the first output end of the each limiting amplifier;
   a second resistor having a first end coupled the system voltage and a second end coupled to the second output end of the each limiting amplifier;
   a third transistor having a first end coupled to the first output end of the each limiting amplifier, a second end coupled to a first end of the first transistor, and a control end coupled to a first limiting amplifier bias;
   a fourth transistor having a first end coupled to the second output end of the each limiting amplifier, a second end coupled to a first end of the second transistor, and a control end coupled to the first limiting amplifier bias; and
   a fifth transistor having a first end coupled to a second end of the first transistor and a second end of the second transistor, a second end coupled to a reference voltage, and a control end coupled to a second limiting amplifier bias.

5. The power detector of claim 4, further comprising a limiting amplifier bias circuit, wherein the limiting amplifier bias circuit comprises:
   a sixth transistor having a first end coupled to a current source and a second end coupled to the reference voltage;
   a seventh transistor having a first end coupled to the system voltage and a control end coupled to the current source;
   a first resistor having a first end coupled to the control end of the sixth transistor, and a second end coupled to the second end of the seventh transistor for outputting the second limiting amplifier bias;
   a first capacitor having a first end coupled to the second end of the first resistor and a second end coupled to the reference voltage;
   a second resistor having a first end coupled to the system voltage and a second end for outputting the first limiting amplifier bias; and
   a third resistor having a first end coupled to the second end of the second resistor.

6. The power detector of claim 3, wherein each rectifier further comprises:
   a first transistor having a first end coupled to the output end of the each rectifier, and a control end coupled to the first output end of a corresponding limiting amplifier;

a second transistor having a first end coupled to the output end of the each rectifier, and a control end coupled to a second output end of the corresponding limiting amplifier;

a first resistor having:
  a first end coupled to a second end of the first transistor and a second end of the second transistor; and
  a second end coupled to a reference voltage;

a second resistor having:
  a first end coupled to the control end of the first transistor; and
  a second end coupled to a rectifying bias; and a third resistor having:
  a first end coupled to the control end of the second transistor; and
  a second end coupled to the rectifying bias.

7. The power detector of claim 6 further comprising a rectifier bias circuit, and the rectifier bias circuit comprising:
  a third transistor having a first end coupled to a current source; and
  a fourth transistor having a first end coupled to a system voltage and a control end coupled to the current source.

8. The power detector of claim 7, wherein the first transistor has the same width-to-length ratio (W/L ratio) as the fourth transistor.

9. The power detector of claim 3, wherein each of the N+1 rectifiers is a class-B full-wave rectifier.

10. The power detector of claim 3, wherein the attenuation circuit further comprises N attenuation units, wherein:
  an input end of a first attenuation unit of the N attenuation units is coupled to the signal input end, and an output end of the first attenuation unit of the N attenuation units is coupled to the first output end of the N output ends; and
  an input end of an $m^{th}$ attenuation unit of the N attenuation units is coupled to an $(m-1)^{th}$ output end of the N output ends, an output end of the $m^{th}$ attenuation unit of the N attenuation units is coupled to an $m^{th}$ output end of the N output ends, and $1<m\leq N$.

11. The power detector of claim 10, wherein each attenuation unit comprises:

a first resistor having a first end coupled to an input end of the each attenuation unit and a second end coupled to an output end of the each attenuation unit; and a second resistor having a first end coupled to the output end of the each attenuation unit and a second end coupled to a reference voltage.

12. The power detector of claim 10, wherein each attenuation unit comprises:

a first capacitor having a first end coupled to an input end of the each attenuation unit and a second end coupled to an output end of the each attenuation unit; and a second capacitor having a first end coupled to the output end of the each attenuation unit and a second end coupled to a reference voltage.

13. The power detector of claim 1, wherein all of the transistors of the power detector are NPN type bipolar junction transistors.

14. The power detector of claim 1, wherein the inverting amplifier further comprises:
  a first resistor having a first end coupled to a system voltage and a second end coupled to the output end of the inverting amplifier;
  a second resistor having a first end coupled to the output end of the inverting amplifier and a second end coupled to a reference voltage; and
  a transistor having a first end coupled to the second end of the first resistor, a second end coupled to the first end of the second resistor, and a control end coupled to the input end of the inverting amplifier.

15. The power detector of claim 14, wherein the inverting amplifier further comprises:
  a third resistor having a first end coupled to the system voltage and a second end coupled to the input end of the inverting amplifier; and
  a fourth resistor having a first end coupled to the input end of the inverting amplifier and a second end coupled to the reference voltage.

16. The power detector of claim 1 being a logarithmic power detector (LPD).

* * * * *